(12) United States Patent
Schmid (10) Patent No.: US 10,175,318 B2
(45) Date of Patent: Jan. 8, 2019

(54) ISOLATING MR MAGNETIC FIELD PROBES FROM EXTERNAL RF IRRADIATION

(71) Applicant: Skope Magnetic Resonance Technologies GMBH, Zurich (CH)

(72) Inventor: Thomas Schmid, Zurich (CH)

(73) Assignee: Skope Magnetic Resonance Technologies GMBH (CH)

(*) Notice: Subject to any disclaimer, the term of this patent is extended or adjusted under 35 U.S.C. 154(b) by 665 days.

(21) Appl. No.: 14/427,249

(22) PCT Filed: Sep. 13, 2013

(86) PCT No.: PCT/EP2013/069075
§ 371 (c)(1),
(2) Date: Mar. 10, 2015

(87) PCT Pub. No.: WO2014/041147
PCT Pub. Date: Mar. 20, 2014

(65) Prior Publication Data
US 2015/0241530 A1 Aug. 27, 2015

(30) Foreign Application Priority Data
Sep. 13, 2012 (EP) .................... 12184326

(51) Int. Cl.
*G01R 33/422* (2006.01)
*G01R 33/34* (2006.01)
(Continued)

(52) U.S. Cl.
CPC ..... *G01R 33/422* (2013.01); *G01R 33/34092* (2013.01); *G01R 33/385* (2013.01); *H05K 9/009* (2013.01); *G01R 33/58* (2013.01)

(58) Field of Classification Search
CPC ............ G01R 33/422; G01R 33/34092; G01R 33/385; H05K 9/009
See application file for complete search history.

(56) References Cited

U.S. PATENT DOCUMENTS

2008/0023010 A1  1/2008 Inman et al.
2012/0306496 A1* 12/2012 Popescu .......... G01R 33/34007
                                                  324/322

FOREIGN PATENT DOCUMENTS

WO    WO 2011/070466 A1    6/2011

OTHER PUBLICATIONS

Christoph Barmet et al: A Transmit/Receive System for Magnetic Field Monitoring of In Vivo MRI, Magnetic Resonance in Medicine, vol. 62, No. 1 Jul. 1, 2009 (Jul. 1, 2009), pp. 269-276, XP055052590.

(Continued)

*Primary Examiner* — Rodney Bonnette
(74) *Attorney, Agent, or Firm* — George Pappas (57) ABSTRACT

An arrangement for carrying out dynamic magnetic field measurements in a MR imaging or MR spectroscopy apparatus comprises at least one magnetic field probe (2) comprising a MR active substance (4), means (8, 10) for pulsed MR excitation of said substance and means (8, 10) for receiving an MR signal generated by said substance. The magnetic field probe further comprises a radio frequency shield (12) against external high-frequency electromagnetic field irradiation substantially surrounding the magnetic field probe. The shield is composed of conductive elements embedded in a dielectric material. The conductive elements are electrically conductive filaments and/or electrically conductive platelets.

8 Claims, 4 Drawing Sheets

(51) Int. Cl.
*G01R 33/385* (2006.01)
*H05K 9/00* (2006.01)
*G01R 33/58* (2006.01)

(56) References Cited

OTHER PUBLICATIONS

Yonglai Yang et al: Towards cost-efficient EMI shielding materials using carbon nanostructure-based nanocomposites, Nanotechnology, IOP, Bristol, GB, vol. 18, No. 34, Aug. 29, 2007 (Aug. 29, 2007), p. 345701, XP020119505.
Barmet, C., N.D. Zanche, and K.P. Pruessmann, Spatiotemporal Magnetic Field Monitoring for MR. Magnetic Resonance in Medicine 2008. 60(1): p. 187-197.
Barmet, C., et al. Concurrent Higher-Order Field Monitoring for Routine Head MRI: An Integrated Heteronuclear Setup in Proc Intl Soc Magn Reson Med. 2010. Stockholm, Sweden.
Sipilä, P., et al. Continuous Magnetic Field Mapping with Pulsed 1H NMR Probes. In Proc Intl Soc Magn Reson Med. 2010 Honolulu, Hawaii, USA.
Dietrich, B.E., et al. An Autonomous System for Continuous Field Monitoring with Interleaved Probe Sets in Proc Intl Soc Magn Reson Med. 2011. Montreal, Canada.
Han, H., et al., Direct measurement of magnetic field gradient waveforms Concepts in Magnetic Resonance Part A 2010. 36A(6): p. 349-360.
Dietrich, B.E., et al. A Stand-Alone System for Concurrent Gradient & RF Sequence Monitoring in Proc Intl Soc Magn Reson Med. 2010. Melbourn, Australia.
Friis, H.T., Noise Figures of Radio Receivers, in Proceedings of the IRE. 1944. p. 419-422.
Dabirzadeh, A. and M.P. McDougall, Trap design for insertable second-nuclei radiofrequency coils for magnetic resonance imaging and spectroscopy. Concepts in Magnetic Resonance Part B: Magnetic Resonance Engineering, 2009. 35B(3): p. 121-132.
Yao, Z., et al., Simulation guidelines for incisions patterns on RF shields. Concepts in Magnetic Resonance Part B: Magnetic Resonance Engineering, 2012. 41B(2): p. 37-49.
Weyers, D. and Q. Liu. An RF Shield Comparative Study of Different Materials and Types. in Proc Intl Soc Magn Reson Med. 2004. Kyoto, Japan.
Řimská, Z., Křesálek, V., and Špaček, J. AC Conductivity of Carbon Fiber-Polymer Matrix Composites at the Percolation Threshold. Polymer Composites, 2002. 23(1): p. 95-103.

* cited by examiner

ISOLATING MR MAGNETIC FIELD PROBES FROM EXTERNAL RF IRRADIATION

This application claims priority from PCI application No. PCT/EP2013/069075 filed Sep. 13, 2013 which claims priory from European application No. EP 12184326.2 filed Sep. 13, 2012, the disclosures of which are incorporated herein by reference.

FIELD OF THE INVENTION

The present invention relates to an arrangement for carrying out dynamic magnetic field measurements in a magnetic resonance imaging (MRI) or magnetic resonance (MR) spectroscopy apparatus.

BACKGROUND OF THE INVENTION

The monitoring of gradient waveforms and more generally of the spatio-temporal magnetic field evolution concurrently with the actual MRI scan has recently been established under laboratory conditions ([1], [2]). It has been shown to be an effective means of correcting image reconstruction from data acquired in the presence of gradient waveform imperfections, eddy currents and field drifts, when combined with adequate image reconstruction algorithms. For the purpose of field monitoring, MR based magnetic field detectors, also called magnetic field probes, are used. When performing the monitoring experiment concurrently with the MRI scan, interference between the MR experiment performed by the MR arrangement and the MR signal generated by the MR field probes can cause various problems. The most important are:

1. Contamination of the signal acquired from the object stemming from the field probe's MR RF signal.
2. Contamination of the signal acquired from the object stemming from the field probe's RF excitation pulse.
3. Contamination of the signal acquired from the field probe by the MR RF signal stemming from the object.
4. Contamination of the signal acquired from the field probe by the power RF signal applied by the MR arrangement to excite the object within.
5. Coupling of MR RF signal between MR based magnetic field probes.

It is well known that the signals stemming from the observed MR coherences in the object and field probes respectively, can effectively by separated by operating the MR field probes on a nucleus different from the nucleus observed in the actual MR scan ([1-3]). However, the signals used for excitation of the MR object and the MR active substance of the field probe are of substantially higher power than the received MR signals from the object/probe. Therefore the coupling between the transmit RF path of one nucleus and the receiver of the other can impose challenges to the dynamic range of the receiver chain and cause saturation effects in the retrieved signal or even destruction of the receiver. This typically prevents the acquisition of meaningful magnetic field measurements during RF pulses played out by the MR arrangement and also prevents the field probe excitation during object signal acquisition without corrupting the acquired object signal.

In many situations it would be desirable to overturn one or both of the aforementioned constraints. Examples comprise measurements of the magnetic field evolution during spatially selective RF pulses and measurements of the magnetic field evolution over an entire sequence having multiple RF pulses such as (Multi-) Spin-Echo, Steady State Field Precession (SSFP) or Stimulated Echo Acquisition Mode (STEAM). Another example is the excitation of field probes during acquisition phases of the MR scanner without corrupting the acquired object signal, which is particularly desirable when field probes are targeted for rapid and/or interleaved re-excitation ([3], [4], [5]).

In order to prevent the saturation of the receiver chains it is well known that narrow band filters can be used in case different nuclei are applied in the object and the field probes respectively [6]. The filter has to be placed in the signal receive chain such that the first potentially saturating device is protected. Due to the typical amount of coupling (−40 dB to −20 dB) of the MR field probe and transmitters/receivers of the MR scanner, already the first amplification stage (a preamplifier with low noise figure) can suffer from saturation effects and hence the filter has to be placed at its input. The insertion loss of this filter is very critical for the SNR performance of the entire system according to Frii's formula [7]. Typically tradeoffs need to be made between insertion loss in the pass band, stop band depth and compactness of the filter device. Even in the optimal case the remnant insertion loss degrades the SNR retrieved.

Alternatively to filters, trap structures on the coils can be used to reduce the coupling between the two systems [6, 8].

However, in the case the field probes and the MR system operate at the same frequency band, such filters and traps cannot be employed to reduce the net coupling between the two systems.

In some cases the RF power transmission signal strength coupled into receivers or field probes can already cause non-linear effects in passive structures, such as tuning circuits or (variable) capacitors.

An alternative to frequency selective blocking or mutual geometrical or lumped element decoupling is shielding of the MR field probe [9].

A wet-chemically deposited and electroplated thin metal shielding around the magnetic field probe has been proposed to reduce said coupling [9]. A thin (≈22 μm) copper layer was chosen for shielding since the shielding effectiveness at RF frequencies (where the shielding effect is wanted) is only marginally impaired due to the skin effect, while the adverse effect of low (i.e. acoustic) frequency eddy currents running in the metallic surface on the magnetic field measurement is minimized by the low DC conductivity of the thin copper layer. Still, as experienced in [9] the remnant eddy current effects at low frequencies caused the measured temporal field evolution by the probe to be significantly distorted, which was approximated and modeled by a delay. Furthermore this corruption of the measurement was experienced to be anisotropic to the external field direction and spatial modulation. It is to be noted that further reduction of the low frequency eddy currents by reducing the metal layer thickness or the conductivity of the metal impairs the shielding performance at RF frequencies if the layer thickness shrinks to the order of the skin depth at the given RF frequencies. Hence the optimization of low eddy currents at low frequency and high conductivity for shielding at high frequencies is inherently limited by the thin film shielding approach.

Slotting and capacitive coupling of the shield structure is another known approach to improve the performance of MR compatible RF shields [10]. Furthermore metal mesh structures have been employed [11].

While these approaches proved useful to shield an MR coil from the magnet and gradient coil structures, the shielding and eddy current suppression performance for shielding a MR field probe from the coil of the MR scanner was found to be too low.

Therefore, an object of the present invention is to provide an improved arrangement for carrying out dynamic magnetic field measurements in a MR imaging or MR spectroscopy apparatus which allows for improved probe shielding at radio frequencies in the range from about 40 MHz to about 800 MHz as well as for improved suppression of eddy currents.

Yonglai Yang et al. (Nanotechnology, 2007. 18(34): p. 345701-345704; XP 020119505) have proposed using carbon nanostructure based-nanocomposites in order to improve cost efficiency of electromagnetic interference (EMI) shielding in the microwave frequency range of 8.2 to 12.4 GHz ("X-Band").

WO 2011/070466 A1 discloses various types of RF shields configured as ground plane for an electric circuit board with openings, which is aimed at preventing vibration and heating caused from eddy currents in a magnetic resonance scanner. One type of shields comprises layers of interweaved conductive fibers. However, this kind of shield needs to be provided with gaps between the interweaved fibers in order to provide openings for suppressing time-varying magnetic field gradient-induced vibration.

SUMMARY OF THE INVENTION

According to the present invention there is provided an arrangement for carrying out dynamic magnetic field measurements in a MR imaging or MR spectroscopy apparatus, the arrangement comprising at least one magnetic field probe, said magnetic field probe comprising a MR active substance, means for pulsed MR excitation of said substance and means for receiving an MR signal generated by said substance;

said arrangement further comprising a shield against external high-frequency electromagnetic field irradiation, said shield substantially surrounding the magnetic field probe, said shield having at least one RF contact to the RF ground of the field probe, said shield having at least one shielding portion, said shielding portion being composed of conductive elements embedded in a dielectric material, said conductive elements being a) electrically conductive filaments, said conductive filaments being present in a length-density of at least 500 mm/mm$^3$ and at most $10^{12}$ (one trillion) mm/mm$^3$;

and/or b) electrically conductive platelets, said conductive platelets being present in an area-density of at least 100 mm$^2$/mm$^3$ and at most $10^9$ (one billion) mm$^2$/mm$^3$.

In order to achieve the desired shielding effects, a galvanic contact of the shield structure to at least the RF ground surface of the field probe or the MR arrangement is needed.

Advantageous embodiments of the arrangement are described below.

According to one embodiment, the conductive elements are electrically conductive filaments.

The term "filaments" as used herein means the fundamental entity of a tissue. A filament is an elongated (i.e. at least 10 times longer than wide) body with the shape of a cylinder or tube, typically twistable. Filaments can be yarned to a thread before being processed to a tissue by weaving, crocheting, or the like.

The filaments are present in some volume density in the shield. Important is the length-density in which the filaments are present. The length-density is defined as the total length of all filaments present in a volume, having a unit of (typically) [mm/mm$^3$]. Thereby it does not matter how many filaments are present in a given volume [mm$^3$], only their accumulated length counts. For example, if filaments of 10 µm diameter and 1 mm length are placed adjacent to each other, 100 filaments in a row and 100 rows on top of each other, these filaments just fill one cubic millimeter and have a total length of 100×100×1 mm=10,000 mm, which corresponds to a length-density of 10,000 mm/mm$^3$. This is also the maximum length-density possible for filaments of 10 µm diameter. In practice, filaments are typically present in a less tight packing, resulting in a lower length-density.

The length-density can be assessed by adding up the lengths of the filaments present in a piece of volume of the shield. For example, a 0.1 mm$^3$ voxel can be excised from the shield and the filaments be extracted (by dissolving the matrix or pulling out the filaments), and the total filament length be measured to assess the length-density of the filaments in the RF-shield at hand.

It will be understood that the above defined length-density value merely apply to those parts of the shield structure that are needed to provide the required electrical shielding. The shield structure may contain further parts or volume sections containing no filaments or having only very low filament density (e.g. sections that are used for mechanical reasons). Such parts or sections may be considered as auxiliary shield elements and thus shall not be considered for the length-density determination.

For efficient RF-shielding, the filaments shall be placed in the vicinity of one another, but with most of the filaments not physically touching each other, and therefore not forming a DC contact, but rather crossing or running in parallel at short distance. Such a geometric structure offers capacitance that allows RF currents to flow between the filaments while exhibiting large resistance for DC and low frequency currents. For this reason, care should be taken not to overly compress the filament arrangement e.g. when embedding the same in the dielectric material.

With this configuration, no openings are required between the interweaved fibers. On the contrary, a dense network of (e.g., carbon) fibers is required to get a large number of crossing points and stretches where the fibers run in parallel, these spots being responsible for the large cross capacitance required to generate a frequency dispersion in the shield between DC/low AC and RF frequencies. The density of these networks is such that they will look opaque to the human eye, with inter-fiber spacings at most well below the fiber diameter.

A multitude of filament crossings/parallel runs will enhance the shielding performance. Shields from purely unidirectionally oriented filaments for example suffer a loss in shielding performance (depending on the orientation of the applied fields) due to the fact that direct cross capacitance is only built up between the neighboring filaments.

It should be noted that, on the one hand, a copper (or other metallic) mesh from fine filaments with a filament length-density of at least 500 mm/mm$^3$, where the filaments form a DC contact essentially in every crossing point, will exhibit strong eddy currents down to low frequencies and thus is unsuitable for the purpose of the present invention.

On the other hand, copper (or other metallic) mesh from fine filaments with a filament length-density of at least 500 mm/mm$^3$, where the filaments are electrically DC insulated (with typical enamel thicknesses on the order of some micrometers) relative to each other (e.g. by an enamel layer around the wire), will exhibit a poor RF shielding performance, in particular in the near field of RF transmitters and thus is also unsuitable for the purpose of the present invention.

In order to turn a copper (or other metallic) mesh from fine filaments with a filament length-density of at least 500 mm/mm$^3$ into a good RF shield with little low frequency eddy currents, the number of DC contacts in crossing points would have to be decreased to a very small proportion of the total number of crossing points, e.g., by mechanically rupturing the insulating layer in a number of crossing points, or the cross-capacitance would need to be extremely increased over the one present in a standard mesh by resorting to ultra-thin enamel thicknesses (<1 um) and thin (<10 um) copper fibers.

According to an advantageous embodiment, the conductive filaments are present with a length-density of at least 1,000 min/mm$^3$, preferably at least 2,000 mm/mm$^3$, and more preferably at least 5,000 mm/mm$^3$.

In one embodiment, the electrically conductive filaments each have a length that is essentially the same as the largest shield dimension. Taking the example of a tube-like shield, the conductive filaments would extend in axial direction and have a length substantially corresponding to the tube length. This does not exclude the presence of a certain amount of shorter filaments, which, however, were found to be substantially less effective than longer filaments.

In principle the conductive filaments can be made from a variety of materials. According to one embodiment, the conductive filaments are carbon filaments. According to another embodiment, the conductive filaments are copper filaments, i.e. sections of thin copper wire. According to a further embodiment, the conductive filaments are metalized non-conductive threads. Alternatively, the conductive filaments can be made of an electrically conductive polymer, zirconium or molybdenum. According to a further embodiment, the conductive filaments form a woven fabric or tissue.

According to a particularly advantageous embodiment, said electrically conductive filaments consist of a first amount of first filaments and a second amount of second filaments, the DC conductivity of said first filaments being smaller than the DC conductivity of said second filaments, said first amount being larger than that second amount. Such an arrangement very efficiently shorts out electric fields along the direction of the highly conductive filaments.

Advantageously, the first filaments having comparatively smaller DC conductivity are carbon filaments.

According to one embodiment, said second filaments are copper filaments provided with an insulating layer, the insulating having a thickness of about 100 nm to about 1 μm.

According to another embodiment, said second filaments are aluminum filaments provided with a layer of aluminum oxide. In particular, the aluminum oxide layer may be the native layer of aluminum oxide that is readily formed on any aluminum object exposed to ambient air.

According to one embodiment, said first amount in terms of length density is at least 10 times larger, preferably 100 times larger, than that second amount in terms of length density.

According to another embodiment, the DC conductivity of said first filaments is at least 500 times smaller, preferably at least 3000 time smaller, than the DC conductivity of said second filaments.

According to one embodiment, said second filaments are substantially parallel to each other.

According to another embodiment, said first filaments are substantially orthogonal to said second filaments. By adjusting the direction of the high-conductive filaments to the present field pattern (e.g. created by nearby RF transmitter coils), the RF shielding performance can be enhanced while keeping the induced eddy currents at a moderate level. The capacitance between the two filament types causes the required frequency selectivity, blocking low frequency currents. The resistance in the low-conductive filaments serves for absorbing RF currents, thus creating RF shielding.

According to yet another embodiment, the conductive elements are electrically conductive platelets.

The term "platelets" as used herein means essentially disc- or flake-shaped structures that are much thinner (i.e. at least 10 times thinner than wide) than their face diameter. Circular symmetry is not key, i.e. the faces of the platelets can have considerably different dimensions along different in-plane directions.

The platelets are present in some volume density in the shield. Important is the area-density in which the platelets are present. The area-density is defined as the total area of all platelets present in a volume, having a unit of (typically) [mm$^2$/mm$^3$]. Thereby it does not matter how many platelets are present in a given volume [mm$^3$], only their accumulated area counts. For example, if square platelets of 50 μm edge length and 100 nm thickness are placed adjacent to each other, 20 platelets in a row and 20 rows side by side forming a square plane, and if 10,000 of these planes are stacked on top of each other, these platelets just fill one cubic millimeter and are of a total area of 20×20×10,000×0.0025 mm$^2$=10,000 mm$^2$, which corresponds to an area-density of 10,000 mm$^2$/mm$^3$. This is also the maximum area-density possible for platelets of 100 nm thickness. In practice platelets are typically present in a less tight packing, resulting in a lower area-density.

The area-density can be assessed by adding up the areas of the platelets present in a piece of volume of the shield. For example, a 0.1 mm$^3$ voxel can be excised from the shield and the platelets be extracted (by dissolving the matrix or pulling out the platelets), and the total platelet area be measured to assess the area-density of the platelets in the RF-shield at hand. As discussed further above in relation to filaments, the shield structure may contain parts or volume sections that contain no or only very low platelet density (e.g. sections that are used for mechanical reasons); these sections need to be excluded from the area-density determination.

Critically for their RF-shielding performance, these platelets must be brought into close vicinity of one another and/or any filaments present in the shield in order to create large areas of overlap. Such a structure creates considerable capacitance that allows for the passage of high-frequency currents while blocking low-frequency currents. Coplanar orientation of platelets parallel to the shielding surface in several layers, where the platelets overlap different platelets in other layers allows for creating considerable net capacitive coupling in the macroscopic surface. The value of the capacitance between different platelets and layers can be tuned by the distance between platelets, their relative orientation, overlap and density. These factors can be tuned by appropriate manufacturing processes. In particular, pressure or magnetic fields can be used for platelet alignment. More anisotropic orientations might be achieved by stirring the platelet dielectric precursor mix (e.g. aluminum glitter in epoxy) and fast curing of the matrix.

According to an advantageous embodiment, the conductive platelets are present with an area-density of at least 200

$mm^2/mm^3$, preferably at least 500 $mm^2/mm^3$ and more preferably at least 1000 $mm^2/mm^2$.

In one embodiment, the electrically conductive platelets are selected from the group consisting of aluminum platelets, copper platelets and silver-coated platelets.

According to a further embodiment, the conductive platelets are graphite sheets. It will be understood that such sheets must be sufficiently thin to achieve an area-density of at least 100 $mm^2/mm^3$.

According to the present invention, the above described conductive elements (i.e. filaments and/or platelets) have to be embedded in a dielectric. This dielectric can be a gas (e.g. air or nitrogen), vacuum, a solid matrix such as epoxy, rubber polyurethane or silicone, a matrix from non-conductive yarn, a liquid (e.g. a fluorocarbon based fluid such as the products available from 3M Company as Fluorinert®) etc. The embedding dielectric can also consist of a combination of dielectric structures and materials. Potentially the dielectric material might form a structure that mechanically supports and stabilizes the shield or even forms the casing of the field probe. According to an advantageous embodiment, the dielectric material is formed of an epoxy resin.

The large range of conductive and dielectric materials that can be used for the present invention is beneficial for a number of purposes.

- Filament-conductivity, -density, -length, -orientation and -spacing can be adjusted so as to tune the electrical properties of the shield. RF-shielding power and direction-dependence can be tuned to the electromagnetic environment of the probe as well as the application. E.g., when shielding a probe nearby a transmit antenna, its electromagnetic field-pattern and amplitude will determine the probe-shielding needs; unidirectional tissue suitably oriented might suffice in this situation. In some applications gradient-induced eddy currents on the shield can be tolerated (e.g., gradient-free spectroscopic acquisition schemes), while in other applications (e.g., fast-switching MR acquisition schemes) they must be reduced to a minimum.
- The large range of possible materials caters to many manufacturing processes, allowing for easy and inexpensive shield production. On the side of the conductive material fibers, possibly chopped or milled, fleece, fabric, UD-fabric, tissue woven in all kinds can be used. On the side of the dielectric epoxy, silicone, polyurethane, etc. or liquids or gases can be utilized. Therefore the possible manufacturing processes include injection molding, extrusion, laminating, coiling, etc.
- Finally the RF-shield can simultaneously provide mechanical robustness. In particular carbon fiber reinforced plastics allow for stiff, lightweight constructions that can form the housing for a field probe.

As known in the art, the MR imaging or spectroscopy apparatus generally comprises:

- a main magnet for generating a static magnetic field in a volume of interest,
- gradient and/or shim coils for generating gradient and shim magnetic fields, respectively, superimposed to the static magnetic field;
- an excitation RF coil for exciting magnetic resonance in an object arranged within said volume of interest;
- a receive RF coil for acquiring object MR signals from said object (the receive RF coil possibly physically coinciding with the excitation RF coil);
- a control unit controlling said coils to apply an RF pulse sequence and acquire said object MR signals from said object;

The MR field probe is configured to measure the local magnetic field at the position of MR field probe.

In the present context, an MR based magnetic field probe generally comprises a magnetic resonance (MR) active substance, means for pulsed MR excitation of said substance and means for receiving an MR signal generated by said substance. Such MR probes have been described, e.g., in EP 1 582 886 A1 or in WO 2007/118715 A1.

The MR magnetic field probes can be operated both on an electron spin transition or on a nuclear magnetic resonance transition. In an advantageous embodiment, the field probes operate on a nuclear magnetic resonance transition. Examples of suitable nuclei comprise, but are not limited to, $^1H$, $^{19}F$, $^{13}C$ or $^2H$.

In a possible embodiment a plurality of magnetic field probes are operated. As explained in EP 1 582 886 A1, it may be advantageous to operate them in a temporally interleaved manner, either for individual probes or for groups of probes.

The present shield substantially surrounds parts of each MR field probe that are significantly sensitive to external RF fields or parts thereof by shielding the probe from one or several transmit, transceive and/or receive coils of the MR imaging arrangement or other field probes in the setup. Depending on the specific situation, the shield will have to almost completely surround the probe, merely allowing for passage of the required cable, whereas in other situations it may be acceptable to have the shield only surround certain parts of the probe arrangement. Thereby it reduces the signal level of the RF transmit pulses in the receive lines of both, the probe and the MR arrangement or in the latter case the stray coupling between probes. Unlike typically applied MR shields, these shields reside inside or close to the imaging volume of one or several coils of the MR arrangement. The shield shall thereby minimally influence the magnetic field dynamics especially at acoustic frequencies and allow a substantially uniform magnetic field in the MR active sample of the probe. Since the shielding material resides very close to the magnetic field probes, only minute distortions of the magnetic field at acoustic frequencies induced by the shield are tolerable. Traditional approaches of shields consisting of thin, slotted or meshed metal conductors do not comply with this requirement. However, the required properties can be achieved by constructing a shield from of a hetero-/metamaterial which is composed of a mesoscopic structure of substantially conductive fibers and a substantially dielectric material.

Unlike bulk, sheet or meshed conductive materials, such hetero-/metamaterials allow for increasing the ratio between the conductivity at high frequencies vs. that at acoustic frequencies and DC. A high ratio reduces eddy currents on the shields at acoustic frequencies while maintaining effective shielding at high frequencies.

In a mesoscopically structured material this ratio can be controlled and optimized not only by the conductive sheet thickness and the conductivity of the conductive material but also by the relative and absolute geometrical orientation, thickness, length and density of the conductive fibers as well as by the density and resistance of the contact points between the individual fibers or fiber arrangements. These parameters can be influenced by braiding, stranding, weaving, laminating, coating, compressing or tensioning of the conductive fibers in the final material or during the manufacturing process. Further, tuning the electrical properties of the dielectric material by material choice, fillers or appropriate process parameters (temperature, pressure, curing, annealing) can yield further optimization or altering the wetting and/or foaming abilities of the dielectric materials.

In a preferred embodiment laminate structures of carbon strands, fabrics or braids molded in epoxy, rubber, polyurethane or silicone are used.

In a favorable implementation the shield is cylindrical with its long axis aligned with the z-axis of the probe with circular, elliptical, oval or square cross-section. Furthermore the shield can be conical in the long axis.

The shield material preferably resides in a distance between about 2 mm to about 15 mm from the MR active substance of the enclosed probe.

The shield can additionally be slotted or consist of two or more parts which might facilitate manufacturing.

In one embodiment such composite shielding material substantially or partially integrates also the function of a mechanical part such as a housing, stiffening, vibration reduction and/or mounting of the probe.

Shielding materials of lower DC and AC conductivity can be used if the thickness of the material is increased or several, potentially complementary structured layers are used. In this manner the RF shielding effectiveness can be achieved with thinner, higher AC conductive materials at equal or even lower DC or low frequency conductance. This is of special interest for materials with a comparably low volume density of conductive fibers, since in this case a very high ratio between low and high frequency conductivity can be achieved (see Ref. [12]).

BRIEF DESCRIPTION OF THE DRAWINGS

The above mentioned and other features and objects of this invention and the manner of achieving them will become more apparent and this invention itself will be better understood by reference to the following description of various embodiments of this invention taken in conjunction with the accompanying drawings, wherein are shown.

DETAILED DESCRIPTION OF THE INVENTION

Figure 1:
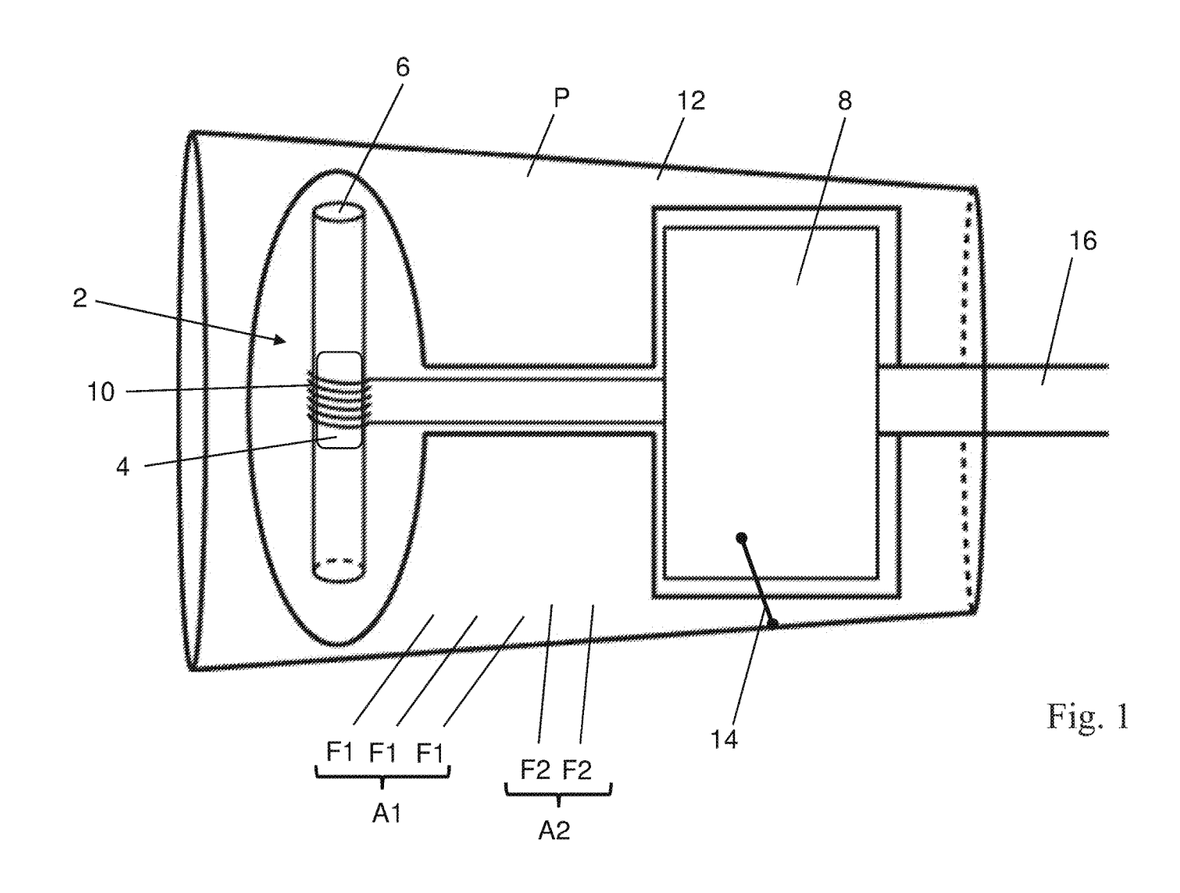
FIG. 1 a schematic representation of a MR field probe surrounded by a RF shield, the latter being shown in a partially cut-away view.

An arrangement for carrying out dynamic magnetic field measurements in a MR imaging or MR spectroscopy apparatus is shown in FIG. 1. The arrangement comprises a magnetic field probe 2 featuring a MR active substance 4 contained in a small tube 6. The arrangement further comprises means for pulsed MR excitation of the substance and means for receiving an MR signal generated by the substance, namely a tuning/matching circuitry 8 with a coil 10 arranged around a central portion of tube 6.

A shield 12 against external high-frequency electromagnetic field irradiation is arranged surrounding the magnetic field probe 2. The shield 12 has at least one RF contact 14 to the RF ground of the field probe 2. The tuning/matching circuitry 8 has at least one cable 16 or group of cables) exiting through an aperture in the shield 12 and connected in known manner to external control, receive or transceive devices. As also generally known, the cable might be equipped with cable traps. In the example shown here, the shield is of substantially frustoconical shape, but any other appropriate shapes such as cylindrical or even irregular may be used. In general, the shield shape will be selected according to the shape of the magnetic-field probe and tuning/matching circuitry, but also and depending on the orientation of any interfering RF fields from which the probe shall be protected. As described elsewhere herein, the shield is composed of conductive elements, namely platelets P and/or filaments F, which can comprise a first amount A1 of first filaments F1 and a second amount A2 of second filaments F2, embedded in a dielectric material.

The ratio between the AC conductivity at RF frequencies (>10 MHz) and the conductivity at low frequencies (<1 MHz) is the most important determinant factor for the performance of shield that is compatible with dynamic magnetic field measurements. Having a low net conductance at low frequencies ensures low distortions on field measurements by the induced eddy currents, while a high net surface conductance at RF frequencies is needed for an effective shielding of the field probe from the rest of the MR arrangement.

In the present invention this ratio is improved by the usage of the mesoscopic structure of composite materials consisting of conductive fibers and a dielectric filling (spacing/bracket) material (which could even be a gas).

As described in the literature [12], the ratio of the surface conductance at low and high frequencies can be markedly controlled by the density, length and relative orientation of the fibers in the filling material but also by tuning the galvanic contact resistance between the fibers by coatings and spacers. Examples for said coating materials are materials consisting essentially of polyurethane, polyester imides, polytetrafluorethylene, (fluorinated) ethylene propylene, acrylic, polycarbonate, polyvinylic, or other polymers such as those known under the tradenames Kapton® (a polyimide film by DuPont), stretched polyethylene terephthalate (PET) (sold e.g. by DuPont as Mylar®), aramide (sold e.g. by DuPont as Nomex®), polybutylenterephthalate (sold e.g. by DuPont as Crastin®), a PET-polyester resin sold e.g. by DuPont as Rynite®, or systems or multiple layers thereof. This allows for control of the DC conductance and the AC conductance not only by the electrical material properties of the conductive fibers and the high resistive dielectric material, but also by tuning the mesoscopic structure of the material by coating the conductive fibers, using different weaving (braiding, knitting) density and patterns of said fibers in the matrix, laminating, stitching, riveting, localized or distributed conductive gluing of sheets of conductive fibers and altering the process parameters used in the production of the mesoscopic material such as the pressure, cast mold compression, fabric tension, temperature and annealing parameters. Also chemical or physical foaming can be applied to the dielectric material to vary the mesoscopic structure in the material.

The overall conductance of the material can be tuned by the density and conductivity of the galvanic connections between the conducting fibers as well as by the conductivity of the fibers themselves.

The conductance can also be rendered anisotropic by layering and structuring of the direction of the fibers and their interconnection; this can be beneficial, e.g., to avoid eddy currents in extended structures. Unilateral fiber structures in particular can be used to avoid large planar eddy currents, since there the DC conductance is low in one direction only. Optionally several layers of such materials with anisotropic conductance can be stacked or interwoven with each other. Controlling the net conductivity between the layers opens up the possibility of further tuning the DC conductivity of the material. This can be achieved by tuning the number of the crossing (or kissing) points either by their contacting crossing density (interleaved wavering), by the amount of laminating pressure applied, by the use of (composite) materials which expand during curing, or by tuning the conductivity of each crossing by low conductive coatings of the fibers. Alternatively substantially isotropic fiber arrangements as found in non-woven fabrics can be used.

Due to the very close proximity of the conductive fiber structures in the matrix, a high amount of capacitive and inductive coupling is established between the individual fibers within the material. This contribution to the AC conductivity is typically increasing with frequency and causes the desired frequency dependent conductivity.

The dielectric constant of the filling material can be used as a further parameter to optimize the frequency dependence of the surface conductivity. Especially polyester, vinyl ester, epoxy, phenolic, polyimide, polyamide, polypropylene, polyetheretherketone (PEEK), silicone and other polymers can be used as a filling material. The dielectric properties of the filling material can further be improved by adding high dielectric powders such as barium titanate ($BaTiO_3$), carbon black, magnesium titan oxides, tantal oxide, niobium oxide and other high dielectric materials frequently used for ceramic capacitors such as Z5U, Y5V, X7R, etc.

The arrangement and the density of the fibers, the number and the resistance of the contacts occurring at crossing points can be tuned by various methods. For instance the length of the fibers can be altered. Furthermore the fibers can be stranded and/or woven or knitted or braided into a fabric. In this process the amount of conductive fibers and non-conductive fibers can be altered in order to tune the conductivity of the fabric or for improving the mechanical properties of the resulting fabric. The geometry of the fabric will have a wide influence on the shielding properties such as unidirectional weaving vs. crossed weaving. Moreover coatings can be applied to the individual fibers or strands. These coatings can either be of high electrical resistance in order to increase the contact resistance between the fibers or strands, thereby lowering the surface conductance of the final material, or also of high conductivity for the opposite purpose.

The conductive fibers can consist of a metal such as for instance copper, silver, gold, steel or a metal composite material such as a copper clad polymer. Furthermore non-conductive fibers such as polyester, cotton, etc. can be metalized to achieve a high conductivity. Also non-metallic conducting fibers as carbon, graphite, conductive polymers, zirconium, molybdenum fibers or carbon black can be used as conductive strands in the shield. Moreover also combinations of different types of conductive fibers can be advantageous such as copper wires woven into a carbon fabric. An embodiment of unidirectional (e.g.) carbon fabric combined with woven (e.g.) copper wires into a different direction prevents high amounts of planar low frequency eddy currents while offering a high shielding capability especially against high frequency electric field components in said direction and allows for establishing a galvanic contact to the carbon fibers. Also strands of one or several different types of fibers can be used.

The conductive fiber material can be cast, molded or laminated into dielectric materials. In a particular embodiment the dielectric can also consist of gas. Also thermal or vacuum shrinking or contact gluing between two dielectric materials (e.g. capton, polyethylene, polycarbonate, FR4, etc. foils) can be applied or the dielectric structure can be attached to the surface of another substrate by gluing, press fitting, riveting or sewing. The process parameters of these fixation processes can further be used to influence and optimize the shielding property of the final material. Examples for this are the application of pressure during casting, molding or laminating onto the woven or non-woven fabric, which typically brings the conductive fibers closer together and hence increases the conductance of the final material especially at low frequencies. It is therefore sometimes preferable to reduce the pressure from the molds onto the fabric. Furthermore wetting, swelling and/or foaming agents can be used to increase the average distance between the conductive fibers or the dielectric material. Alternatively appropriate agents (hardener, liquefier) can be added to achieve this effect. Moreover the fiber material can be stretched or swaged before being laminated or molded.

The molding/lamination process of the conductive fibers can potentially be directly used to form the housing of the field probe or a part thereof and the fibers can be chosen to improve the mechanical properties thereof.

Galvanic contact to the shield structure for proper grounding or electrostatic discharge protection can be ensured in several ways:

- A conductive (metallic) pad can be cast/pressed onto the conductive fibers at least in one position.
- Highly conductive strands, wires or braids can be woven into or pressed onto the matrix at least where the contact shall be made.
- High densities of conductive powder (as found, e.g., in conductive glue) can be applied to contact the conductive fabrics at least at the position where the contact shall be made.
- The conductive fibers can be contacted by rivets or other press fits, metallic or not.
- The conductive fibers can be accessed by said methods either before or during the molding or lamination process, but also afterwards by beveling, grinding or polishing the material mechanically or chemically at least at the position where the contact shall be made.

Figure 3:
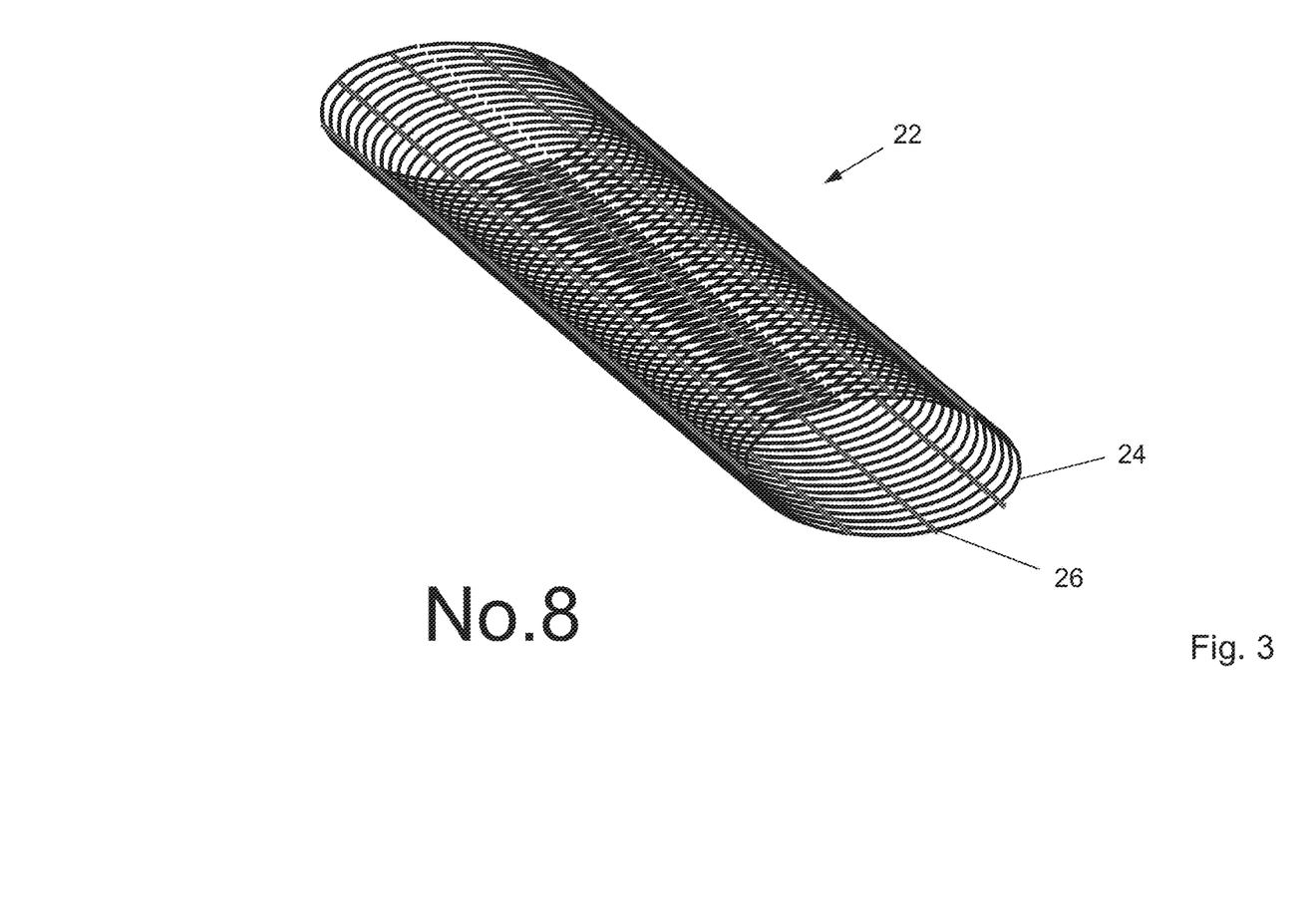
FIG. 3 a further embodiment of an RF shield, in a schematic perspective view.

In a further embodiment as shown in FIG. 3 (Example #8 below), an RF shield 22 comprises low-conductive first filaments 24 and highly conductive second filaments 26. In the example shown, the RF shield is substantially cylindrical and thus has a longitudinal axis. The second filaments are copper filaments arranged substantially parallel to each other along the longitudinal axis direction of the RF shield whereas the first filaments are carbon filaments arranged in substantially circumferential manner around the longitudinal axis. In this example the two filament types couple capacitively via a thin insulating layer between the two filament types, which each form a substantially cylindrical layer of the RF probe.

Examples and Results

Figure 2A:
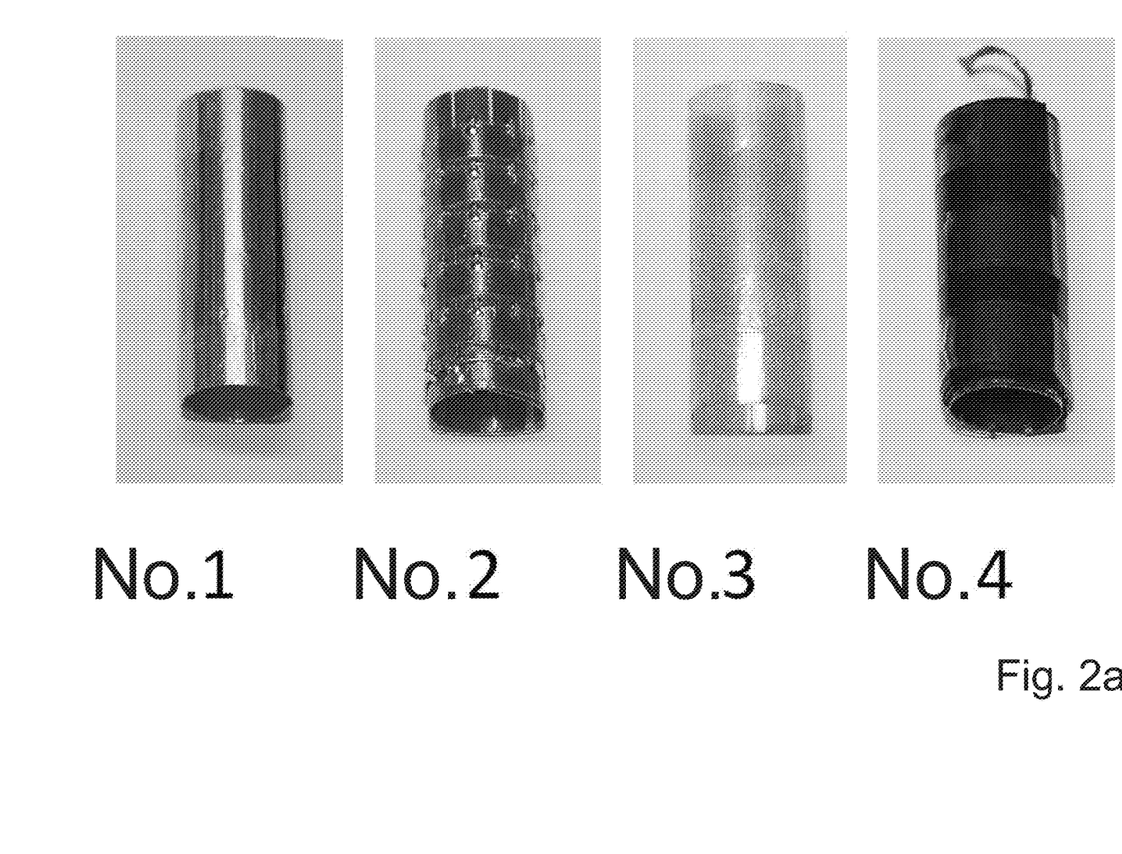
FIG. 2 various embodiments of RF shields, in a photographic representation.
Figure 2B:
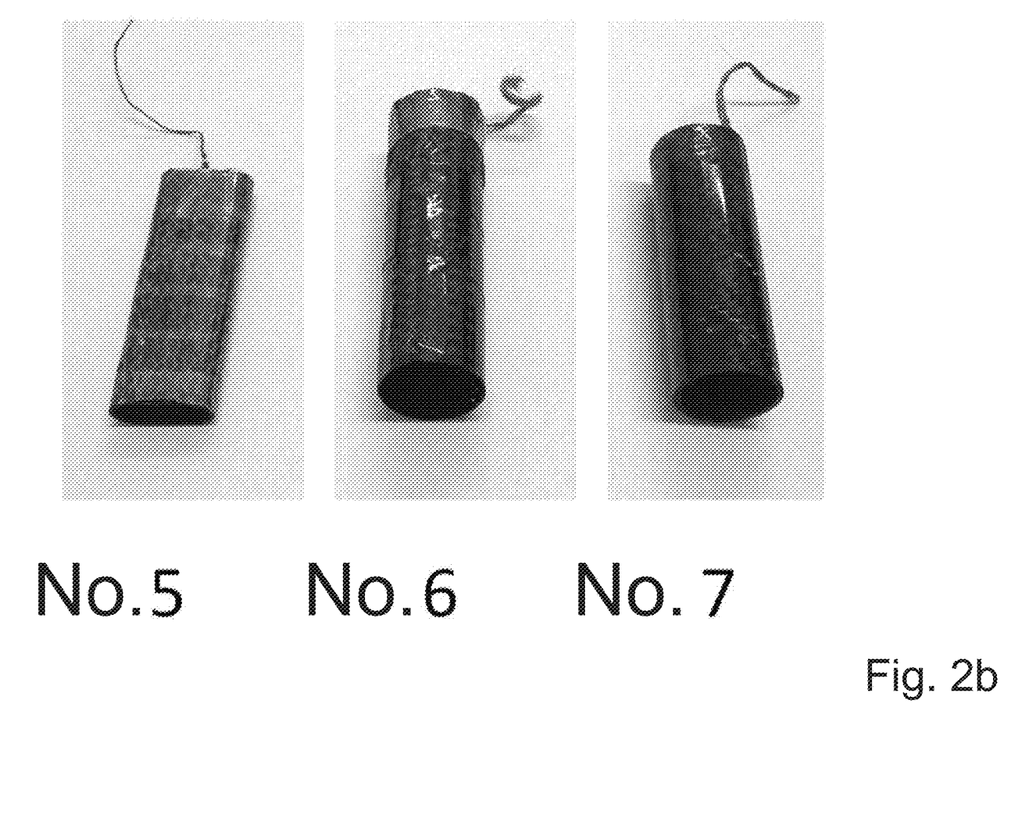

Shields from different shielding materials have been tested for their RF shielding capability and for their low frequency compliance. The shields are depicted in FIG. 2a (comparative examples=prior art) and in FIGS. 2b and 3 (examples=invention), and their principal characteristics are summarized in Table 1.

Where applicable, Table 1 not only lists the filament length density per volume (in $mm/mm^3$) as described elsewhere herein, but also the filament length density per area (in $mm/mm^2$) as additional information.

TABLE 1

Compilation of tested RF shields

| Item | Shield # | Description | Filament density mm/mm² | Filament density mm/mm³ |
|---|---|---|---|---|
| Comparative Example | 1 | Solid copper foil (25 μm) | 0 | 0 |
| Comparative Example | 2 | Slotted copper foil with capacitor bridges | 0.25 | 5 |
| Comparative Example | 3 | Copper mesh | 4 | 50 |
| Comparative Example | 4 | Heavily graphite-loaded silicone | not defined | not defined |
| Example | 5 | Carbon braided hose (3K, 0.30 mm thick), laminated in epoxy, diameter 6 × 18 mm², 60 mm long | 3'000 | 10'000 |
| Example | 6 | Carbon braided hose (3K, 0.30 mm thick), laminated in epoxy, diameter 20 × 20 mm2, 70 mm long | 3'000 | 10'000 |
| Example | 7 | Carbon tissue (3K, 240 g/m²), laminated in epoxy, diameter 18 × 18 mm², 60 mm long | 3'000 | 10'000 |
| Example | 8 | Unidirectional carbon tissue (wound from carbon roving (3K) in a spiral fashion around the shield), combined with 18 copper filaments (110 um diameter, enamel <1 um) mounted equidistantly along the shield axis and perpendicular to the UD carbon tissue, diameter 20 × 15 mm², 48 mm long | 2000 | 10'000 |

The RF shielding capability was determined by measuring the coupling between a $^{19}$F-based magnetic field probe and a stripline resonator tuned to $^1$H for a 7 Tesla setup. The field probe was mounted in close proximity to the stripline in a defined position and orientation, identical for all test cases. The numbers for the RF attenuation in Table 2 reflect the maximum coupling (S21) over the frequency range (250-350 MHz) between a stripline antenna and a field probe when using the different shields. For maximal coupling, the sensor was positioned parallel to the stripline.

The low frequency compliance of the materials has been tested using a human whole body 3 Tesla MRI scanner. The difference between the low frequency magnetic field dynamics measured with and without shield in close proximity of an off-center placed field probe have been measured. Table 2 summarizes the eddy current induced phase errors created by a gradient blip (slope=0.155 ms, duration=0.31 ms, probe position=0.1 m off-isocenter).

While the RF attenuation is rather high for all shields (but shield #4), the eddy current induced phase errors are significant in all shields but the ones based on Carbon braided hose (i.e. shields #5 to 7). Shield #8 having two types of filaments with different conductivity provides particularly good suppression of phase errors.

TABLE 2

Shield performance at kHz and RF frequencies

| Shield # | Phase error [rad] | RF attenuation [dB] |
|---|---|---|
| 1 | 0.35 | −74.8 |
| 2 | 0.02 | −67.8 |
| 3 | 0.01 | −66.4 |
| 4 | 0.01 | −48.6 |
| 5 | 0.00 | −61.3 |
| 6 | 0.00 | −67.7 |
| 7 | 0.00 | −72.4 |
| 8 | 0.000 | −61.2 |

REFERENCES

1. Barmet, C., N. D. Zanche, and K. P. Pruessmann, *Spatiotemporal magnetic field monitoring for MR*. Magnetic Resonance in Medicine, 2008. 60(1): p. 187-197.
2. Barmet, C., et al. *Concurrent Higher-Order Field Monitoring for Routine Head MRI: An Integrated Heteronuclear Setup*. in Proc Intl Soc Magn Reson Med. 2010. Stockholm, Sweden.
3. Sipilä, P., et al. *Continuous Magnetic Field Mapping with Pulsed 1H NMR Probes*. in Proc Intl Soc Magn Reson Med. 2010. Honolulu, Hi., USA.
4. Dietrich, B. E., et al. *An Autonomous System for Continuous Field Monitoring with Interleaved Probe Sets*. in Proc Intl Soc Magn Reson Med. 2011. Montreal, Canada.
5. Han, H., et al., *Direct measurement of magnetic field gradient waveforms*. Concepts in Magnetic Resonance Part A, 2010. 36A(6): p. 349-360.
6. Dietrich, B. E., et al. *A Stand-Alone System for Concurrent Gradient & RF Sequence Monitoring*. in Proc Intl Soc Magn Reson Med. 2012. Melbourn, Australia.
7. Friis, H. T., *Noise Figures of Radio Receivers*, in Proceedings of the IRE. 1944. p. 419-422.
8. Dabirzadeh, A. and M. P. McDougall, *Trap design for insertable second-nuclei radiofrequency coils for magnetic resonance imaging and spectroscopy*. Concepts in Magnetic Resonance Part B: Magnetic Resonance Engineering, 2009. 35B(3): p. 121-132.

9. Barmet, C., et al., *A transmit/receive system for magnetic field monitoring of in vivo MRI*. Magnetic Resonance in Medicine, 2009. 62(1): p. 269-276.
10. Yao, Z., et al., *Simulation guidelines for incisions patterns on RF shields*. Concepts in Magnetic Resonance Part B: Magnetic Resonance Engineering, 2012. 41B(2): p. 37-49.
11. Weyers, D. and Q. Liu. *An RF Shield Comparative Study of Different Materials and Types*. in *Proc Intl Soc Magn Reson Med*. 2004. Kyoto, Japan.
12. MMSKA, Z., V. KRESALEK, and JOSEF SPACEK. *AC Conductivity of Carbon Fiber-Polymer Matrix Composites at the Percolation Threshold*. POLYMER COMPOSITES, 2002. 23(1): p. 95-103.

The invention claimed is:

1. An arrangement for carrying out dynamic magnetic field measurements in a MR imaging or MR spectroscopy apparatus, the arrangement comprising at least one magnetic field probe, said magnetic field probe comprising a MR active substance, means for pulsed MR excitation of said substance and means for receiving an MR signal generated by said substance;

said arrangement further comprising a shield against external high-frequency electromagnetic field irradiation, said shield surrounding the magnetic field probe, said shield having at least one RF contact to the RF ground of the field probe, said shield having at least one shielding portion, characterized in that said shielding portion is composed of conductive elements embedded in a dielectric material, said conductive elements being one or more of a) electrically conductive filaments, said conductive filaments being present in a length-density of at least 500 $mm/mm^3$ and at most $10^{12}$ $mm/mm^3$, with the length-density being defined as total length of all filaments present in a volume;

and b) electrically conductive platelets, said conductive platelets being present in an area-density of at least 100 $mm^2/mm^3$ and at most $10^9$ $mm/mm^3$, with the area-density being defined as total area of all platelets present in a volume;

wherein said conductive elements are electrically conductive filaments; and, wherein said electrically conductive filaments consist of a first amount of first filaments and a second amount of second filaments, the DC conductivity of said first filaments being smaller than the DC conductivity of said second filaments, said first amount being larger than that second amount.

2. The arrangement as defined in claim 1, wherein said first filaments are carbon filaments.

3. The arrangement as defined in claim 1, wherein said second filaments are copper filaments provided with an insulating layer, the insulating having a thickness of 100 nm to 1 µm.

4. The arrangement as defined in claim 1, wherein said second filaments are aluminum filaments provided with a layer of aluminum oxide.

5. The arrangement as defined in claim 1, wherein said first amount in terms of length density is at least 10 times larger, preferably 100 times larger, than that second amount in terms of length density.

6. The arrangement as defined in claim 1, wherein the DC conductivity of said first filaments is at least 500 times smaller, preferably at least 3000 time smaller, than the DC conductivity of said second filaments.

7. The arrangement as defined in claim 1, wherein said second filaments are parallel to each other.

8. The arrangement as defined in claim 7, wherein said first filaments are orthogonal to said second filaments.

* * * * *

UNITED STATES PATENT AND TRADEMARK OFFICE
CERTIFICATE OF CORRECTION

PATENT NO. : 10,175,318 B2
APPLICATION NO. : 14/427249
DATED : January 8, 2019
INVENTOR(S) : Thomas Schmid Page 1 of 1

It is certified that error appears in the above-identified patent and that said Letters Patent is hereby corrected as shown below:

In the Specification

Column 3, Line 59, after 'below', insert --and defined in the depended claims--

Column 9, Line 64, delete "or group of cables)" and insert --(or group of cables)--

Signed and Sealed this
Twenty-third Day of April, 2019

Andrei Iancu
*Director of the United States Patent and Trademark Office*